(12) United States Patent
Sumikawa et al.

(10) Patent No.: US 6,441,500 B1
(45) Date of Patent: Aug. 27, 2002

(54) SEMICONDUCTOR DEVICE HAVING RESIN MEMBERS PROVIDED SEPARATELY CORRESPONDING TO EXTERNALLY CONNECTING ELECTRODES

(75) Inventors: Masato Sumikawa, Kashihara; Kazumi Tanaka, Tenri; Tomotoshi Sato, Tsuchiura, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/660,477

(22) Filed: Sep. 12, 2000

(30) Foreign Application Priority Data

Sep. 13, 1999 (JP) .............................. 11-258460

(51) Int. Cl.[7] .............................................. H01L 29/40
(52) U.S. Cl. ....................................... 257/780; 257/737
(58) Field of Search ................................ 257/780, 737, 257/738, 778

(56) References Cited

U.S. PATENT DOCUMENTS 5,477,087 A * 12/1995 Kawakita et al. ........... 257/737

5,679,977 A   10/1997  Khandros et al.

FOREIGN PATENT DOCUMENTS

| JP | A6177134 | 6/1994 |
|---|---|---|
| JP | A8102466 | 4/1996 |
| JP | A1012619 | 1/1998 |
| JP | A1079362 | 3/1998 |
| JP | A1140590 | 2/1999 |
| JP | B2-2924923 | 5/1999 |
| JP | 11-258460 | 9/1999 |
| JP | 89100924 | 1/2000 |
| JP | 448548 | 8/2001 |

* cited by examiner

Primary Examiner—Roy Potter

(57) ABSTRACT

A semiconductor device having a plurality of externally connecting electrodes arranged on a semiconductor chip includes on-chip electrodes, resin members formed separately from each other and provided corresponding to the plurality of externally connecting electrodes, and interconnections connecting the corresponding on-chip electrode and the corresponding externally connecting electrode. Such separately formed resin members for the externally connecting electrodes allow relaxation of thermal stress produced in the externally connecting electrodes.

16 Claims, 12 Drawing Sheets

ENLARGED VIEW

SEMICONDUCTOR DEVICE HAVING RESIN MEMBERS PROVIDED SEPARATELY CORRESPONDING TO EXTERNALLY CONNECTING ELECTRODES

BACKGROUND OF THE INVENTION

1. Field of the Invention

The present invention relates to semiconductor devices and their manufacturing methods, and more particularly, to a structure of a semiconductor device permitting relaxation of stress after mounting and a manufacturing method of the same.

2. Description of the Background Art

In recent years, there exist increasing demands for more compact and lightweight electronic components such as mobile telephones and mobile information equipment, and accordingly, miniaturization and more dense integration of semiconductor devices have been rapidly advancing. To this end, several proposals have been made. One proposal is bare chip mounting in which a large scale integrated (LSI) circuit chip is mounted directly on a circuit board. Another proposal is to provide a semiconductor device with a so called chip size package (CSP) structure in which the shape of the semiconductor device is made to follow that of the LSI chip as close as possible for miniaturization. In the semiconductor device with this CSP structure, peripheral type electrode arrangement that is common to ordinary LSI chips is converted, by a rewiring step, to area array type electrode arrangement that is advantageous for increasing the number of pins.

FIGS. 1A–1C show an example of the semiconductor device that is used in conventional bare chip mounting. As shown in FIG. 1A, the semiconductor device 21 is formed of a bare chip 22 and a plurality of connecting portions 24. As shown in FIG. 1B, bare chip 22 is connected via connecting portions 24 to electrodes 25a on a printed circuit board 25. With this structure, however, large thermal stress is generated due to a difference of thermal expansion of bare chip 22 and printed circuit board 25, and it is known that connecting portion 24 is unreliable.

Thus, as shown in FIG. 1C, spacing 27 between the undersurface of bare chip 22 and the surface of printed circuit board 25 is generally filled with resin 26 (this is called "underfill") to relax the thermal stress occurring in connecting portions 24. Such underfill of spacing 27 between the undersurface of bare chip 22 and the surface of printed circuit board 25, however, makes repair of bare chip 22 extremely difficult. Thus, although the structure of the semiconductor device shown in FIGS. 1A–1C may enable ultimate miniaturization and extremely dense mounting, it has failed to spread due to various reasons as follows: an increase of cost because additional steps are required for implanting and curing resin 26; a low degree of freedom because repair of bare chip 22 is essentially impossible; and difficulty in handling of bare chip 22 itself. Therefore, there has been a demand for a semiconductor device which permits high-density mounting as in the bare chip mounting, which can be implemented at the least possible cost, and which ensures reliability not only in a single package, but also after mounting.

Several inventions have been disclosed to meet such demands. For example, an invention disclosed in Japanese Patent Laying-Open No. 6-177134, as shown in FIG. 2, is directed to a bump structure of an electronic component. This includes a terminal electrode 32 on an IC chip 31, an insulating layer 33, barrier metal layers 34, 35 and 36 covering terminal electrode 32, a solder bump 37, a coating layer 38, and a resin layer 41 formed between terminal electrode 32 and barrier metal layer 34. This resin layer 41 formed between terminal electrode 32 and barrier metal layer 34 acts to relax thermal stress, thereby improving reliability.

An invention disclosed in Japanese Patent Laying-Open No. 10-12619 or 10-79362, as shown in FIGS. 3A and 3B, is directed to a semiconductor device which includes a substrate 56, a bump 52 arranged on substrate 56, a resin layer 53 sealing bump 52, and an externally connecting bump 50 formed at a tip of bump 52 that is exposed from resin layer 53. Bump 52 is sealed by resin layer 53, and thus, stress produced at a junction of an electrode on substrate 56 and externally connecting bump 50 is relaxed to improve reliability.

An invention disclosed in Japanese Patent Laying-Open No. 8-102466, as shown in FIGS. 4A–4C, includes a wafer 60, a passivation film 62 covering wafer 60, an electrode pad 61 formed on wafer 60, an aluminum interconnect 64 formed to connect to electrode pad 61 and extend within the semiconductor chip region, a nickel plate 65 formed on aluminum interconnect 64, a cover coat film 66 covering the entire surface of wafer 60, and a solder bump 68 formed in an aperture exposing the surface of nickel plate 65.

An invention disclosed in Japanese Patent No. 2924923, as shown in FIG. 5, includes: a semiconductor chip 70; a flexible lead 73 connecting an on-chip electrode pad 71 and an external electrode 72; a flexible sheet insert 74 posed between external electrode 72 and the chip 70; a hole 76 opened in sheet insert 74 corresponding to on-chip electrode 72; and a sealer 75 to fill in hole 76. Stress occurring after mounting the semiconductor device on a printed circuit board 77 via external electrode 72, due to difference of thermal expansion between the board 72 and the chip 70, is relaxed taking advantage of the flexibility of sheet insert 74, lead 73 and sealer 75, thereby improving reliability.

Although the conventional techniques illustrated in FIGS. 2–5 have been proposed to improve reliability by minimizing thermal stress created in the connecting portion and to improve handling as compared to the case of the flip chip bonding of bare chips, they exhibit the following problems.

Assume that thermal stress is produced after mounting the semiconductor device according to the invention disclosed in Japanese Patent Laying-Open No. 6-177134. In this case, as shown in FIG. 6, strain will be accumulated in solder bump 37 on its semiconductor chip side, which may cause a crack 42 to be created, leading to fracture.

Assume again that thermal stress is produced after mounting the semiconductor device of the invention disclosed in Japanese Patent Laying-Open No. 10-12619 or 10-79362. Then, strain will again accumulate in bump 52 in its root portion, as shown in FIG. 7. Further, as resin layer 53 has been formed by filling the spacing with resin leaving no space, the strain attributable to the thermal stress cannot be relaxed. Therefore, a crack 57 leading to rupture may be created due to the accumulated strain at the root of bump 52.

In the case of the invention disclosed in Japanese Patent Laying-Open No. 8-102466, cover coat (resin) film 66 has been applied to the entire surface of the semiconductor chip, hindering the strain from escaping. The strain is thus accumulated in bump 68 in its root portion, which may result in breakage ultimately.

In the invention disclosed in Japanese Patent No. 2924923, the entire surface of sheet insert 74, except for the hole 76, is closely attached to the surface of the chip. Thus, stress occurs at the interface of sheet insert 74 itself and chip 70 due to the difference of their thermal expansion, which may cause detachment thereof. Such detachment of different materials within the semiconductor device structure allows penetration of water, which would then possibly cause electrical short to circuits on the chip, failure such as package crack due to an increased volume under high temperature, or other problems. Further, sheet insert 74 itself may swell with ambient moisture or expand by heat, of which effects on reliability are innegligible.

In addition, a problem common to these conventional techniques is that they have been manufactured with a large number of steps including sputtering and photolithography employing high-cost processing. This increases the manufacturing cost of the semiconductor device itself, which again suppresses the spread of such device.

SUMMARY OF THE INVENTION

An object of the present invention is to provide a semiconductor device having a structure permitting relaxation of stress produced after mounting.

Another object of the present invention is to provide a method of manufacturing a semiconductor device having a structure permitting relaxation of stress produced after mounting.

According to an aspect of the present invention, the semiconductor device having a plurality of externally connecting electrodes arranged on a semiconductor chip includes: on-chip electrodes; resin members formed separately from each other and provided corresponding to the plurality of externally connection electrodes; and interconnections connecting the corresponding on-chip electrode and the corresponding externally connecting electrode.

The resin members provided corresponding to the plurality of externally connecting electrodes are formed separately from each other. Therefore, it is possible to effectively relax thermal stress created at the externally connecting electrodes.

According to another aspect of the present invention, the semiconductor device having a plurality of externally connecting electrodes arranged on a semiconductor chip includes: on-chip electrodes; resin members in a tapering form provided corresponding to the plurality of externally connecting electrodes; and interconnections formed along a slope of the resin member to connect the corresponding on-chip electrode and the corresponding externally connecting electrode.

As the interconnection is formed along the slope of the resin member, the manufacture is simple, and thus, productivity is improved.

According to a further aspect of the present invention, the semiconductor device having a plurality of externally connecting electrodes arranged on a semiconductor chip includes: on-chip electrodes; a resin layer formed to cover the semiconductor chip, having at least one aperture, the externally connecting electrodes being to be formed directly above the resin layer; and interconnections connecting the corresponding on-chip electrode and the corresponding externally connecting electrode.

As the externally connecting electrodes are formed directly above the resin layer, and as at least one aperture is formed in the resin layer, it is possible to effectively relax the thermal stress produced at the externally connecting electrodes.

According to a still further aspect of the present invention, the method of manufacturing a semiconductor device having a plurality of externally connecting electrodes arranged on the semiconductor chip includes the steps of: providing an insulating film on the semiconductor chip at least in a region except on-chip electrode portions; forming resin members or a resin layer at positions where the plurality of externally connecting electrodes are to be formed; forming interconnections connecting the corresponding on-chip electrode and the corresponding externally connecting electrode; providing a material for protection of at least the interconnections; and forming the externally connecting electrodes on the resin members or the resin layer.

As the externally connecting electrodes are formed on the resin members or the resin layer, it is possible to manufacture a semiconductor device permitting relaxation of thermal stress.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
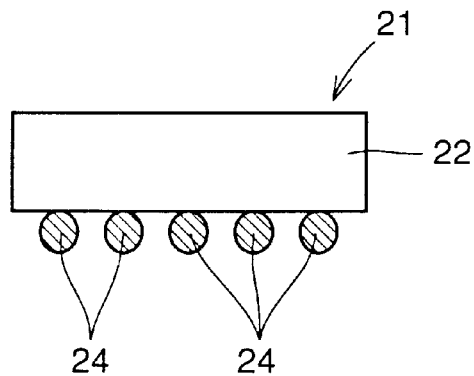
FIGS. 1A–1C show an example of conventional bare chip mounting.
Figure 1B:
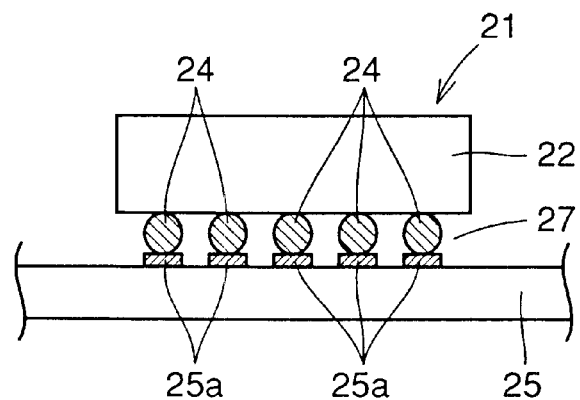
Figure 1C:
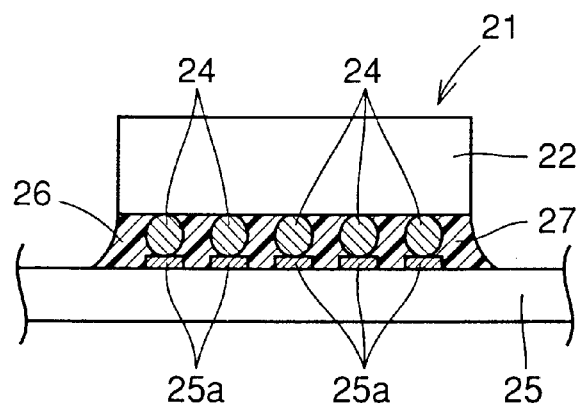
Figure 2:
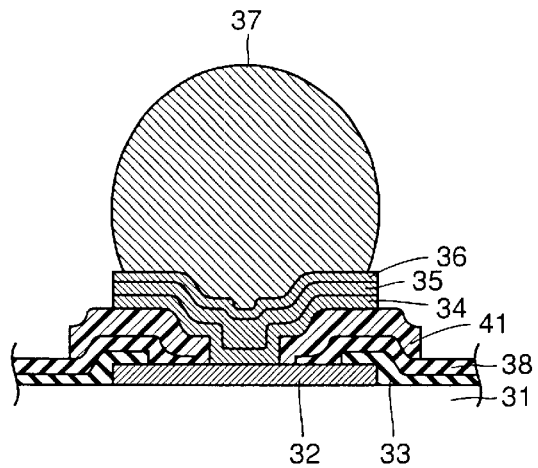
FIG. 2 shows a first example of a bump structure of a conventional semiconductor device.
Figure 3A:
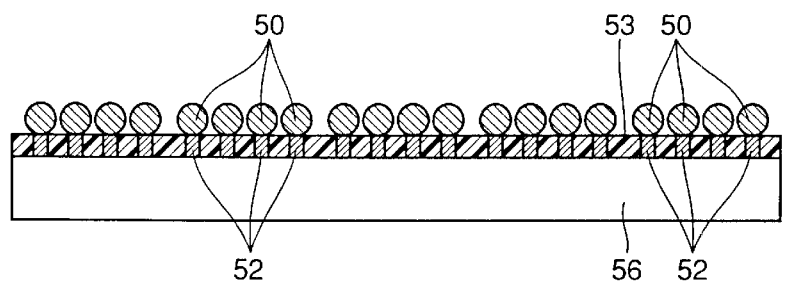
FIGS. 3A and 3B show a second example of the bump structure of a conventional semiconductor device.
Figure 3B:
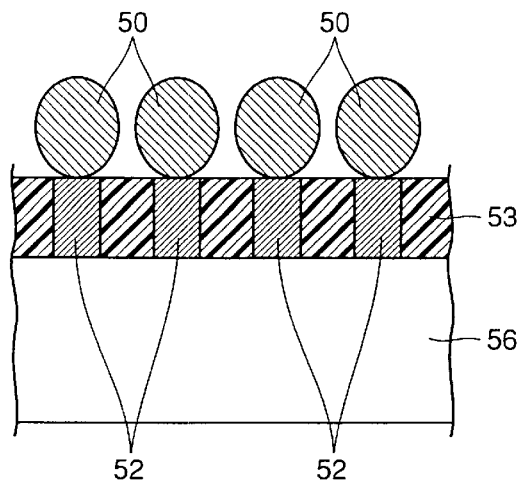
Figure 4A:
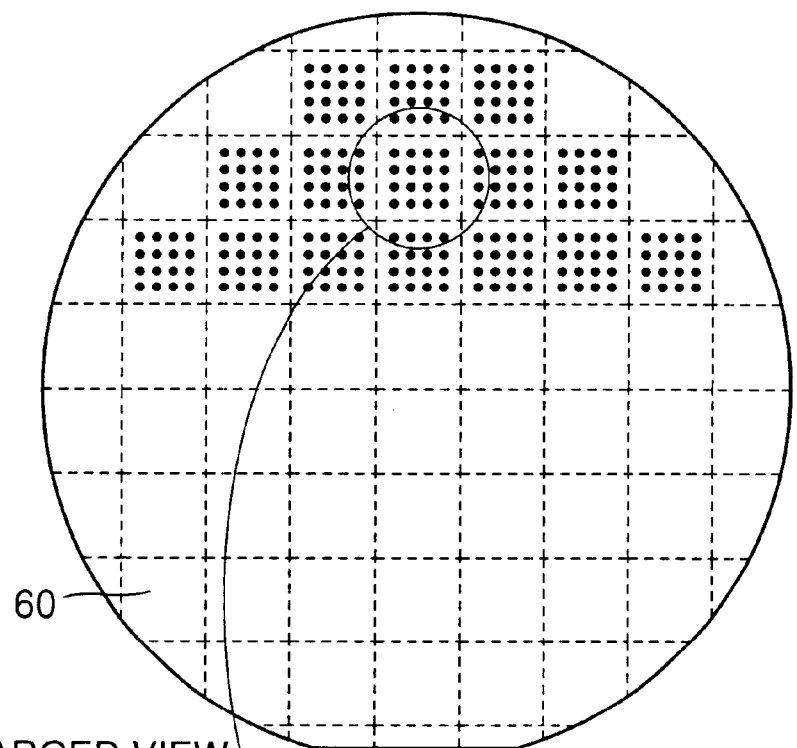
FIGS. 4A–4C show a third example of the bump structure of a conventional semiconductor device.
Figure 4B:
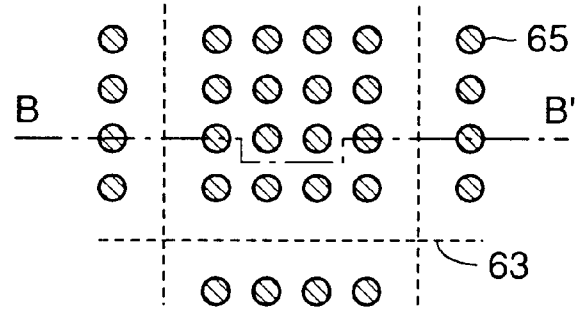
Figure 4C:
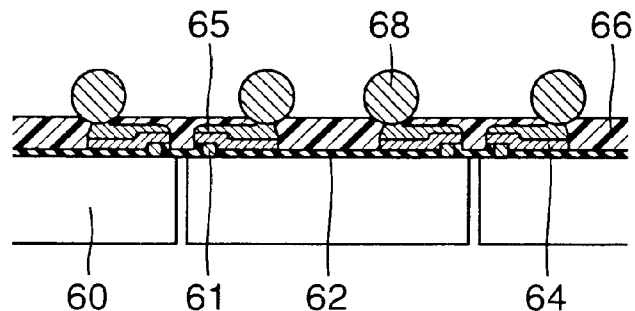
Figure 5:
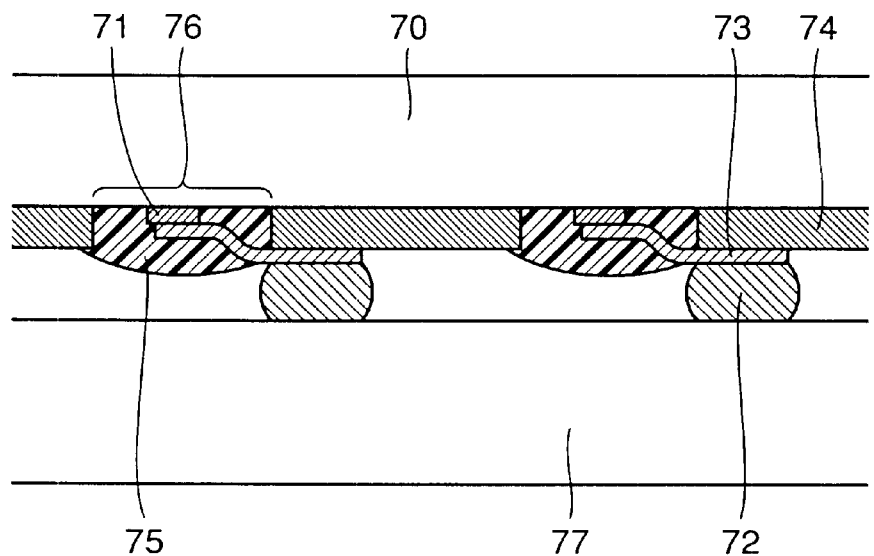
FIG. 5 shows a fourth example of the bump structure of a conventional semiconductor device.
Figure 6:
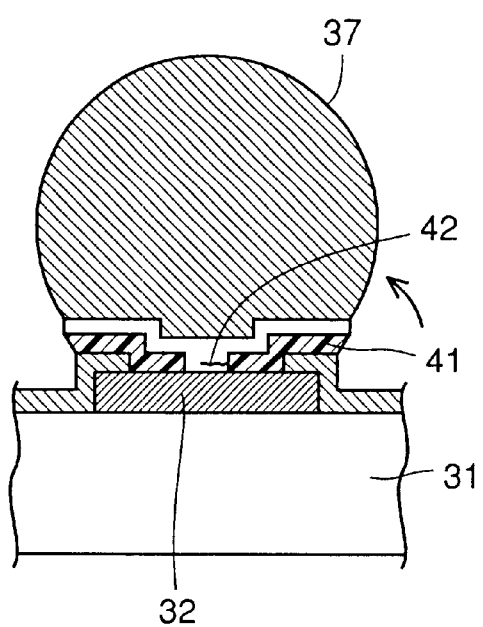
FIG. 6 illustrates a problem of the bump structure of the semiconductor device shown in FIG. 2.
Figure 7:
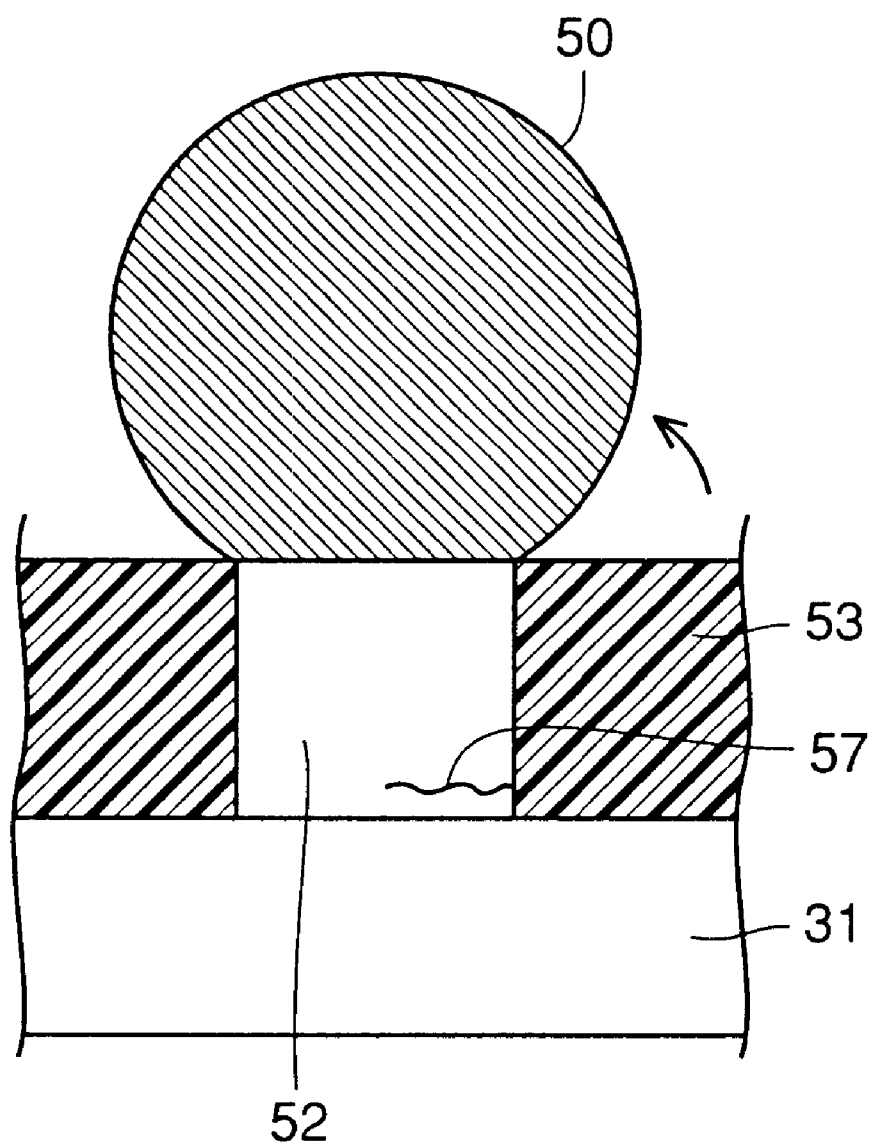
FIG. 7 illustrates a problem of the bump structure of the semiconductor device shown in FIGS. 3A and 3B.

Manufacturing steps of the semiconductor device according to the first embodiment of the present invention will be described with reference to FIGS. 8A–8E, which show cross sections passing through electrode portions. Referring to FIG. 8E showing a state before being divided into individual semiconductor chips, the semiconductor device includes: a wafer 1 on which a plurality of semiconductor chips are being formed; an on-chip electrode (hereinafter, simply referred to as an "electrode") 2 formed on wafer 1; an insulating film 3 formed on wafer 1; a resin member 5 formed at a position where an externally connecting electrode is to be formed; a rewiring pattern or interconnection 6; a protection layer 7 for protection of rewiring pattern 6; and an externally connecting electrode 8. A dicing line 4 is provided at each boundary of the semiconductor chips.

Figure 8A:
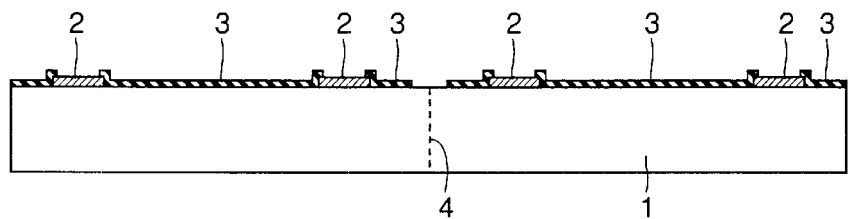
FIGS. 8A–8E illustrate manufacturing steps of a semiconductor device according to a first embodiment of the present invention.

As shown in FIG. 8A, electrode 2 of aluminum, for example, is first formed on wafer 1, followed by formation of insulating film 3. Although insulating film 3 may be formed or not during the first few steps, it can be formed, for example, by spin coating a resin material such as polyimide and then making an opening for electrode 2 by photolithography or the like.

Figure 8B:
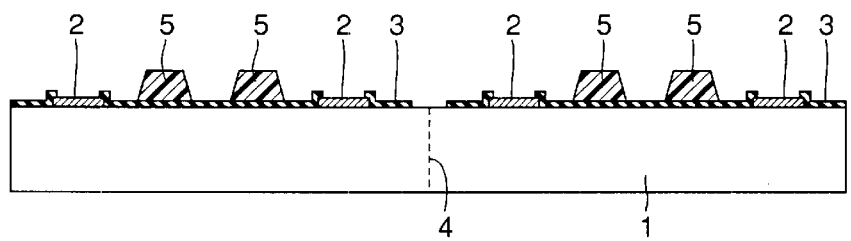

Next, as shown in FIG. 8B, resin member 5 is formed at a position on wafer 1 where externally connecting electrode 8 is to be formed. Resin member 5 is preferably made of a material having good adhesion to insulating film 3 and rewiring pattern 6. Not limited to epoxy system resin, silicone system resin, urethane system resin or rubber system resin, resin of low elastic modulus is desirable as it exhibits good effects to relax stress after mounting. Although any technique may be used for formation of resin member 5, printing, for example, is desirable because of its low cost. For externally connecting electrode 8 having a pitch of, e.g., 0.8 mm, resin member 5 may be formed by screen printing, using a metal stencil of about 0.1 mm thick, as a projection with a diameter of about 0.5 mmφ.

Instead of being formed by spin coating over the entire surface of wafer 1, separate resin members 5 are formed by printing or the like only at respective positions where externally connecting electrodes 8 are to be formed. Thus, thermal stress after mounting can be effectively relaxed. Further, as resin members 5 are formed separately from each other, the interface of each resin member and the chip becomes small, so that the problems of stress and detachment attributable to the property of the resin member itself can be eliminated. When synthetic rubber system resin (LSA-7701 available from Ohgi Chemical Industries) is used, for example, resin member 5 of about 50 μm thick can be obtained from printing employing about 0.1 mm thick stencil and subsequent curing for one hour at a temperature of 175° C.

Alternatively, resin member 5 may be formed using resin that is in a paste form when applied and expands when cured. This facilitates a succeeding interconnection forming step that will be described later in conjunction with FIG. 8C. Specifically, resin in the paste form is applied with a thickness from 10 μm to 30 μm, which is subjected to preliminary curing before formation of the rewiring pattern as described below. Resin then undergoes full curing, thereby expanding to a height of about 50 μm. A structure thus obtained allows simple formation of the rewiring pattern, while maintaining the comparable stress relaxing effects.

Figure 8C:
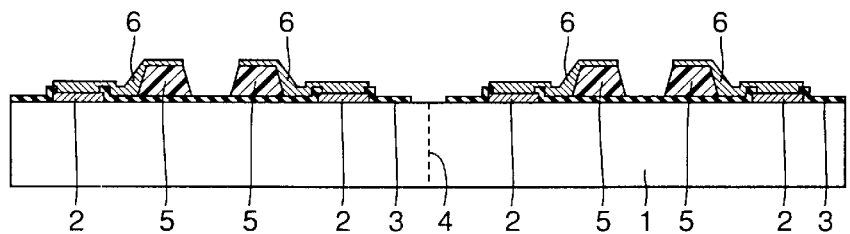

Next, as shown in FIG. 8C, rewiring pattern or interconnection 6 is formed to extend from electrode 2 to a position where externally connecting electrode 8 is to be formed. Although rewiring pattern 6 may be formed using any methods including a known lift-off method, it is desirably formed by printing, for example, at a low manufacturing cost. At this time, paste having metal powder of copper or silver mixed therein may be used to form rewiring pattern 6, which is then subjected to heat treatment at about 150° C. for curing.. In this case, some processing is desirably performed to improve adhesion between electrode 2 and rewiring pattern 6. For example, plasma processing may be conducted to chemically remove any resin remaining on the surface of electrode 2 that was applied during the previous process step. Further, sputtering may be performed to cause sparse, ionized gas molecules to impinge onto wafer 1, so that the junction surfaces of electrode 2 and rewiring pattern 6 are roughened. Thus, adhesion between electrode 2 and rewiring pattern 6 may be physically improved.

If the interconnection pattern formed by printing exhibits large electrical resistance possibly causing voltage drop, heating, signal delay or the like, a process step of electroless plating, for example, may be added to apply a material such as copper or nickel to the interconnection pattern. In the case where the use of such process is predetermined, it is unnecessary to select a conductive material for the pattern formation by printing. All that is needed is to select a material that gives good adhesion to the metal being applied by the electroless plating. With this electroless plating process, not only the electrical resistance of the interconnection is reduced, but also a barrier metal layer is formed for formation of externally connecting electrode 8 on resin member 5. If the electrical resistance value of the rewiring pattern poses no problem, a plated metal layer may be formed only on resin member 5 after the process step that will be described next in conjunction with FIG. 8D.

Figure 8D:
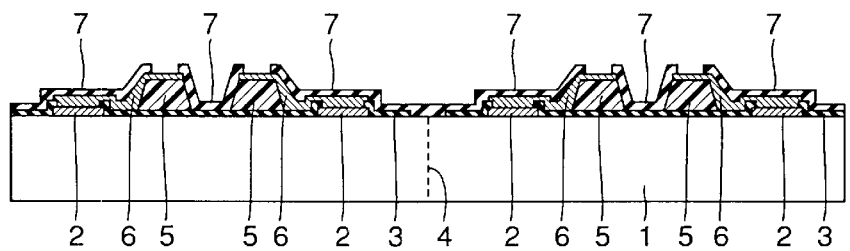
Figure 8E:
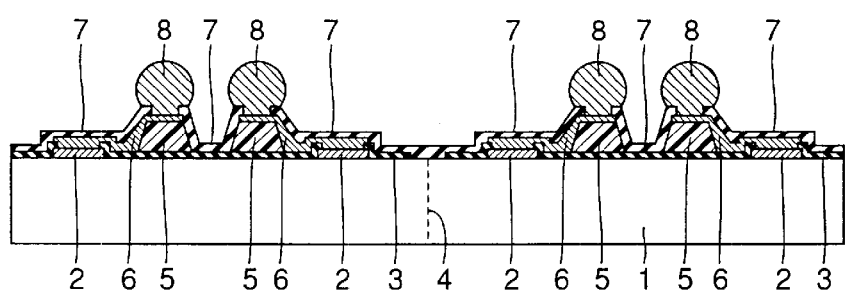

As shown in FIG. 8D, a protection layer 7 for protection of rewiring pattern 6 and the surface of semiconductor chip is formed. Protection layer 7 is formed, for example, by printing or photolithography using photosensitive resin. Here, when the photolithography is being employed, protection layer 7 is formed by spin coating photosensitive resin or the like and then opening a hole at a location where externally connecting electrode 8 is to be formed. On the other hand, if printing is being employed, although it may be somewhat difficult because mounting of ink on an irregular surface should be ensured, it is possible if conditions are optimized. Specifically, the ink and wafer are kept at an air pressure lower than the atmospheric pressure during printing, so that the printing is enabled with sufficient resolution, avoiding entrainment of bubbles. Thus, it becomes possible to form a protection layer with high protection capability at low cost. This printing is also effective for formation of rewiring pattern 6 shown in FIG. 8C.

Next, as shown in FIG. 8E, externally connecting electrode 8 is formed on resin member 5. Specifically, a ball with a base of tin/lead eutectic alloys, for example, is mounted along with flux onto rewiring pattern 6 on resin member 5, and reflow soldering is conducted to form externally connecting electrode 8.

Lastly, wafer 1 is cut along a dicing line 4, whereby individual semiconductor chips are completed. All the manufacturing steps illustrated in FIGS. 8A–8E can be done by wafer processing, using inexpensive printing processes wherever possible. Thus, it is possible to manufacture a semiconductor device at low cost, providing a structure sufficiently relaxing the thermal stress, while eliminating as much as possible the adverse effects of adding the resin members to the structure.

As described above, according to the semiconductor device of the present embodiment, resin member 5 that is formed at a location where externally connecting electrode 8 is to be formed allows relaxation of thermal stress after mounting.

Second Embodiment

Figure 9:
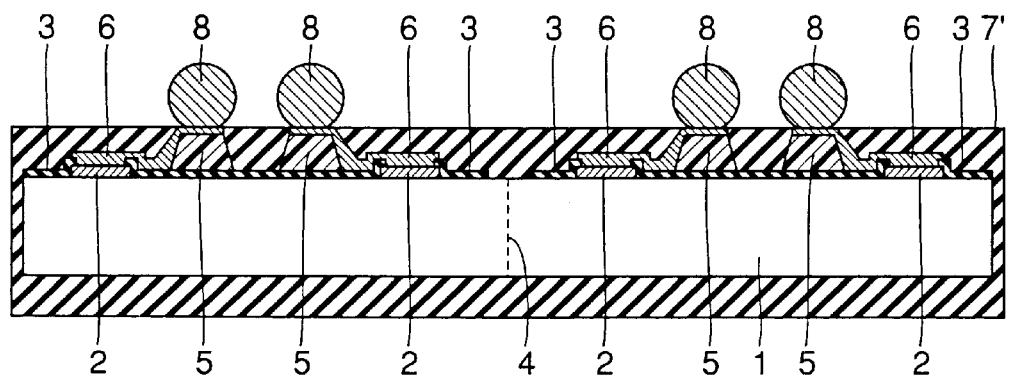
FIG. 9 shows a cross section of the semiconductor device according to a second embodiment of the present invention before being divided into individual chips.

The semiconductor device according to the second embodiment of the present invention, whose cross section before being divided into individual semiconductor devices is shown in FIG. 9, is identical to the semiconductor device according to the first embodiment shown in FIG. 8E, except that protection layer 7 is replaced by a protection layer 7' which covers the front and back sides of the semiconductor chip. The first few steps for formation of the semiconductor device according to the present embodiment are also the same as those in the first embodiment illustrated in FIGS. 8A–8C. Thus, detailed description of the common structures and common manufacturing steps will not be repeated.

When the step shown in FIG. 8C is completed, wafer 1 is secured by a pin or the like above the table with a space therebetween. The surface of rewiring pattern 6 on resin member 5 and the backside of a stencil for printing are closely attached to each other. By printing under low air pressure as described above, protection layer 7' is formed on both the front and back sides of wafer 1. Adjusting vacuum of the ambience ensures that the protection material reaches the backside of the wafer without entrainment of bubbles within protection layer 7'. Since the backside of the stencil and the top portion of resin member 5 are closely attached together, the protection material is prevented from being applied to a position where the externally connecting electrode is to be formed. After formation of protection layer 7', externally connecting electrode 8 is formed. Lastly, the wafer is cut along dicing line 4 and the individual semiconductor chips are completed.

The semiconductor device of the present embodiment is inferior to that of the first embodiment in thermal stress relaxation, since each resin member 5 is embedded in protection layer 7'. With this embodiment, however, the backside of the semiconductor chip is also covered with protection layer 7', so that the semiconductor device of this embodiment is superior in terms of handling to that of the first embodiment. Further, by optimizing the material for use as protection layer 7', e.g., by selecting a material of a low modulus of elasticity, it becomes possible to provide a semiconductor device relatively good in thermal stress relaxation.

Third Embodiment

Figure 10:
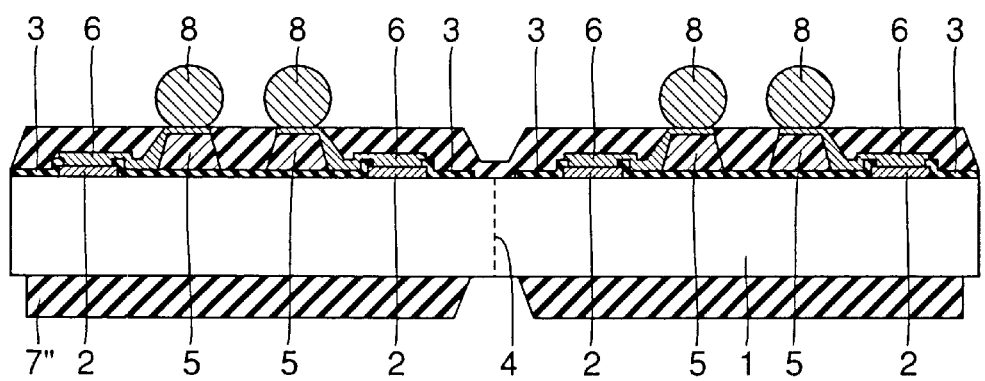
FIG. 10 shows a cross section of the semiconductor device according to a third embodiment of the present invention before being divided into separate chips.

The semiconductor device according to the third embodiment, whose cross section before being cut into pieces is shown in FIG. 10, is identical to the semiconductor device of the first embodiment shown in FIG. 8E, except that protection layer 7 is replaced by a protection layer 7" covering both the front side and the backside of the semiconductor chip. The first several steps for manufacturing the semiconductor device of this embodiment are also the same as those in the first embodiment shown in FIGS. 8A–8C. Therefore, detailed description of the common structures and manufacturing steps are not repeated.

Figure 11:
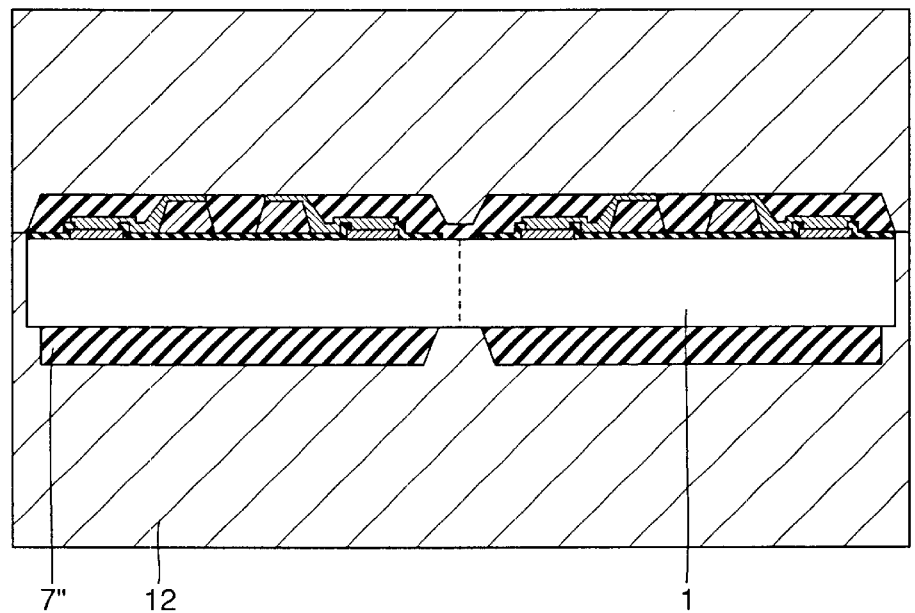
FIG. 11 illustrates formation of a protection layer 7" of the semiconductor device according to the third embodiment.

After completion of the step shown in FIG. 8C, as shown in FIG. 11, wafer 1 is secured by a mold 12 from its both sides, with pressure being applied to the extent that resin members 5 are somewhat pressed inwards. Protection layer 7" is then formed, e.g., by a transfer mold forming method in which a protection material is introduced into mold 12 keeping applying the pressure by mold 12 to wafer 1. Thereafter, when mold 12 is removed, the top of each resin member 5 is exposed from protection layer 7" because of its resilience. Thus utilizing the resilience of resin member 5 ensures exposure of the position where externally connecting electrode 8 is to be formed. This simplifies the manufacturing process, and it becomes possible to provide, at low cost, a semiconductor device that is reliable after mounting.

Fourth Embodiment

The semiconductor device according to the fourth embodiment of the present invention differs from the semiconductor device of the first embodiment shown in FIG. 8E only in the way of forming rewiring pattern 6. The latter steps for manufacturing the semiconductor device of this embodiment are also the same as those in the first embodiment shown in FIGS. 8D and 8E. Thus, detailed description of the common structures and manufacturing steps are not repeated.

Figure 12:
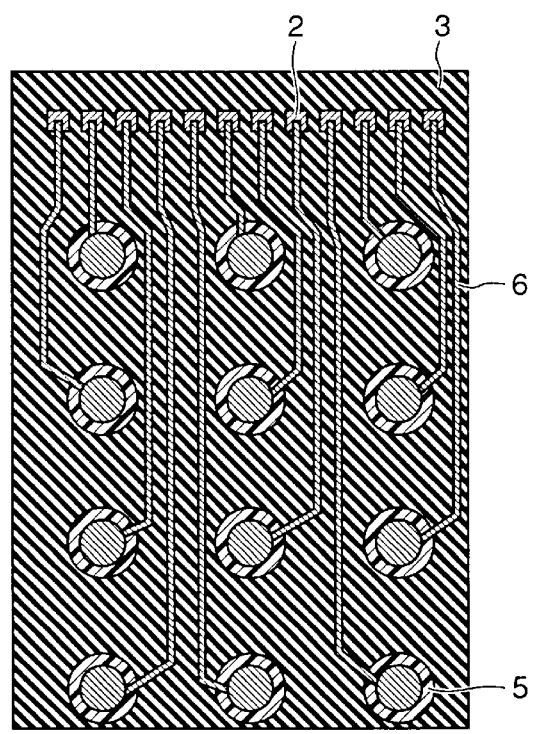
FIG. 12 shows a portion of an upper surface of a wafer 1 after completion of the step illustrated in FIG. 8C.

FIG. 12 shows a portion of an upper surface of wafer 1 at the completion of the step illustrated in FIG. 8C. Insulating film 3 is applied to the surface of wafer 1, and formed thereon are resin member 5 and rewiring pattern 6 connecting the top portion of resin member 5 and electrode 2. In FIG. 12, at most three rewiring patterns 6 run in a valley or elongate depression between adjacent rows of resin members 5 as projections. As the number of pins is increased or the pin intervals are even narrowed, it will become more difficult to form rewiring patterns with good resolution.

Figure 13A:
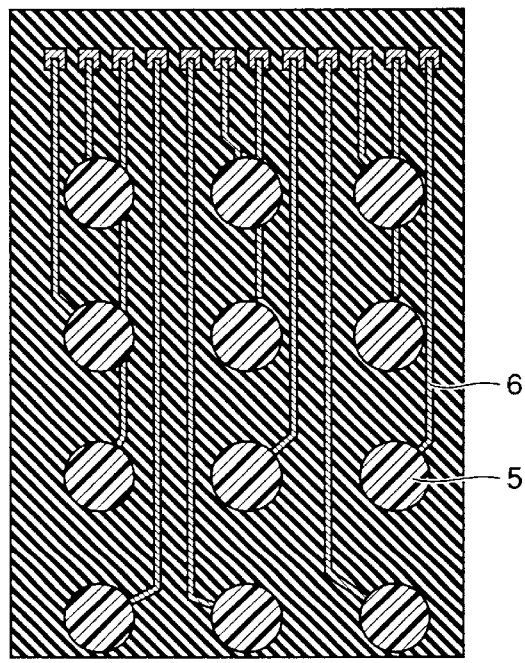
FIGS. 13A and 13B illustrate a method of forming a rewiring pattern or interconnection 6 of a semiconductor device according to a fourth embodiment of the present invention.
Figure 13B:
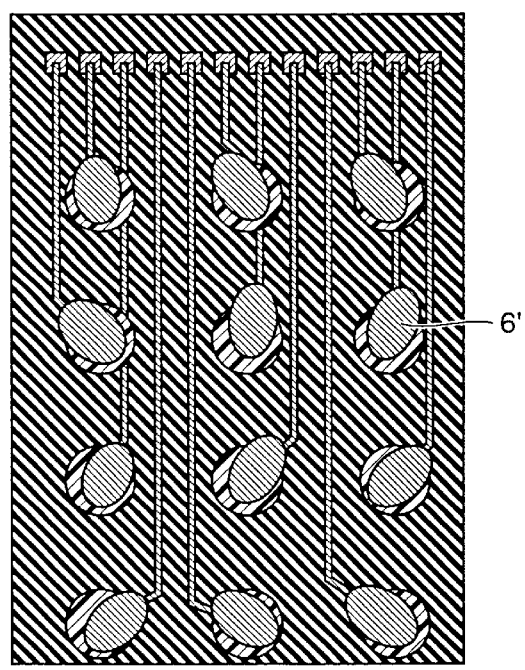

In the manufacturing process of the semiconductor device according to the present embodiment, rewiring pattern 6 is first formed on wafer 1 in the state shown in FIG. 8A. In this case, the formation of the rewiring pattern is simple as it is being formed on flat wafer 1. Then, as shown in FIG. 13A, resin member 5 of about 50 $\mu$m high is formed. While the height of resin member 5 is about 50 $\mu$m, the height of rewiring pattern 6 is at most around 10 $\mu$m. Therefore, precision in formation of resin member 5 is not affected by presence/absence of rewiring pattern 6. Thereafter, as shown in FIG. 13B, an interconnection 6' is formed to electrically connect rewiring pattern 6 and externally connecting electrode 8 that is to be formed on the top of resin member 5. Although this interconnection 6' should be formed over the slope of resin member 5, it will not pose a serious problem since it can be formed with a size on the order of the pitch of external electrode. Thereafter, performing the step shown in FIG. 8D and the subsequent steps, the semiconductor device according to this embodiment is completed.

As described above, according to the semiconductor device of the present embodiment, the rewiring pattern is formed with two separate steps. Thus, it has becomes possible to accommodate to increased number of pins as well as narrowed pin intervals.

Fifth Embodiment

The manufacturing steps of the semiconductor device according to the fifth embodiment of the present invention will be described with reference to FIGS. 14A–14E. The steps themselves are identical to those of the first embodiment shown in FIGS. 8A–8E, although a resin layer 9 replaces resin member 5. Thus, the common structures and the common steps are not repeatedly described in detail.

Figure 14A:
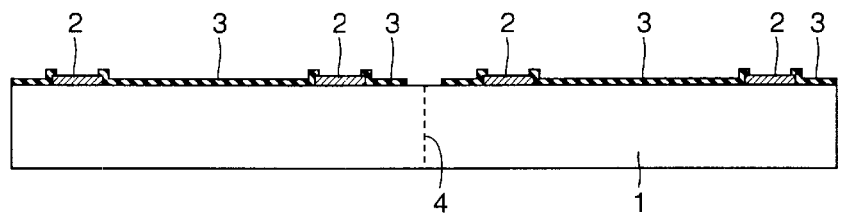
FIGS. 14A–14E illustrate manufacturing steps of a semiconductor device according a fifth embodiment of the present invention.
Figure 14B:
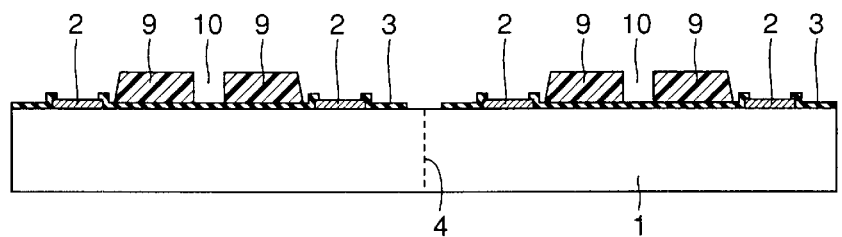
Figure 15:
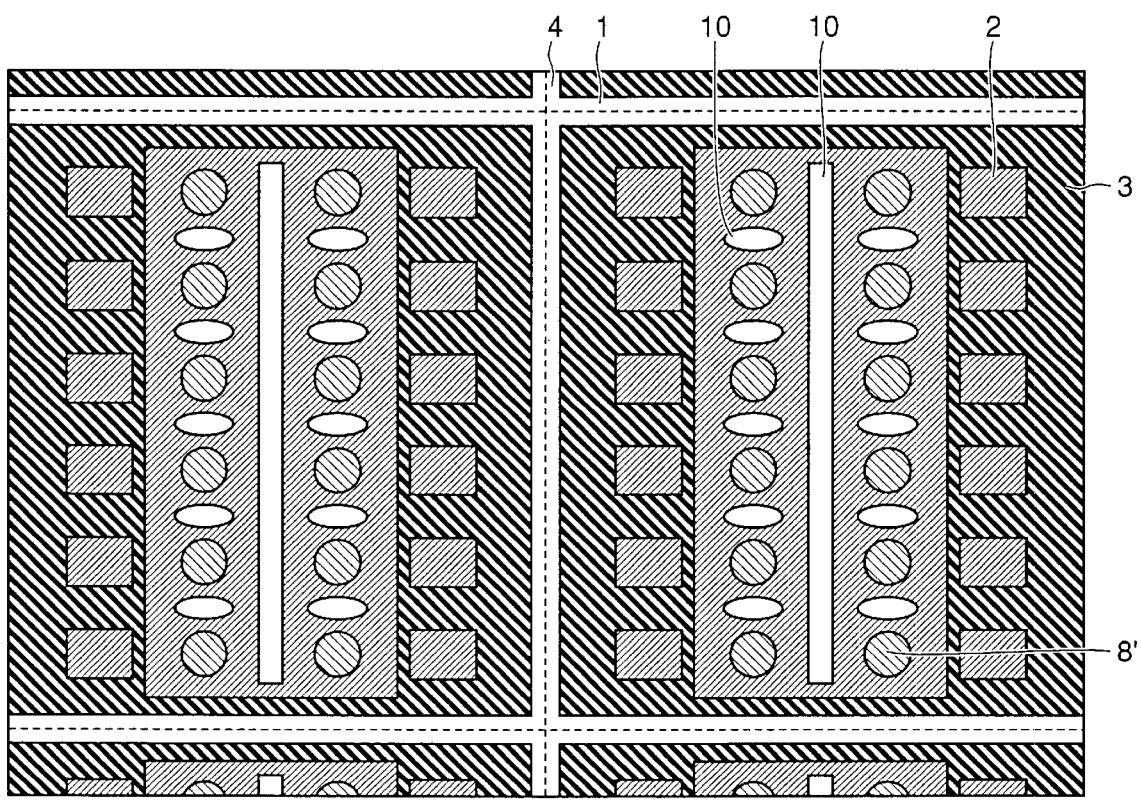
FIG. 15 is a top plan view of a wafer 1 at the step illustrated in FIG. 14B.

FIG. 15 is a top plan view of wafer 1 of the semiconductor device of the present embodiment in the step shown in FIG. 14B. As shown in FIG. 15, resin layer 9 has an opening 10 in at least one position where rewiring pattern 6 connecting electrode 2 and externally connecting electrode 8 is not to be formed. Provision of this opening 10 enhances the effect of relaxing thermal stress compared to the case where the resin layer is applied to the entire surface of wafer 1. Resin layer 9 can be formed with a simple method, e.g., by screen printing. In FIG. 15, the position where externally connecting electrode 8 is to be formed in a subsequent step (the step shown in FIG. 14E) is denoted by 8'.

Some semiconductor chip, e.g., a flash memory, has a region in which a signal line should not be placed directly over an active region. According to the semiconductor device of this embodiment, however, resin layer 9 covers the most part of the semiconductor chip, and therefore, an interconnection can be formed on resin layer 9 in such a region where provision of the signal line is otherwise prohibited. Thus, the degree of freedom for rewiring increases as compared to the case of the semiconductor device of the first embodiment.

Further, according to the semiconductor device of this embodiment, almost all the rewiring can be finished on resin layer 9. Therefore, a plurality of interconnection lines need not be placed between rows of resin members 5 as in the semiconductor device of the first embodiment. Thus, the interconnections can be readily formed in good resolution.

Figure 14C:
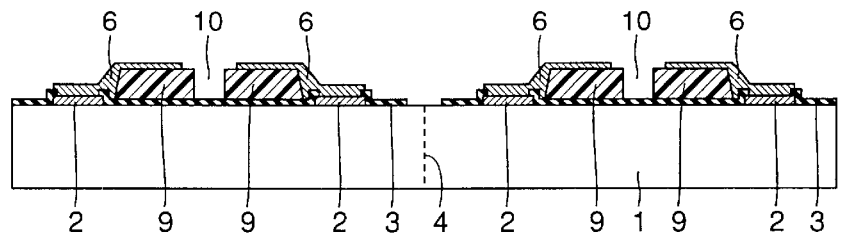
Figure 14D:
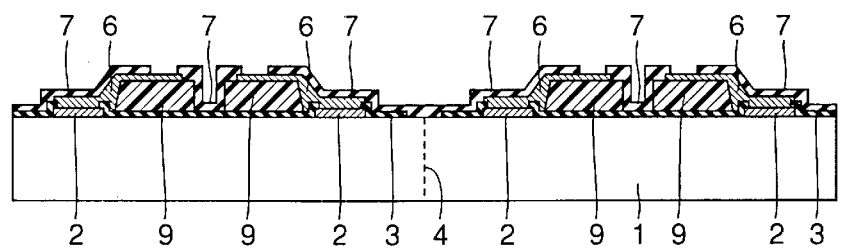
Figure 14E:
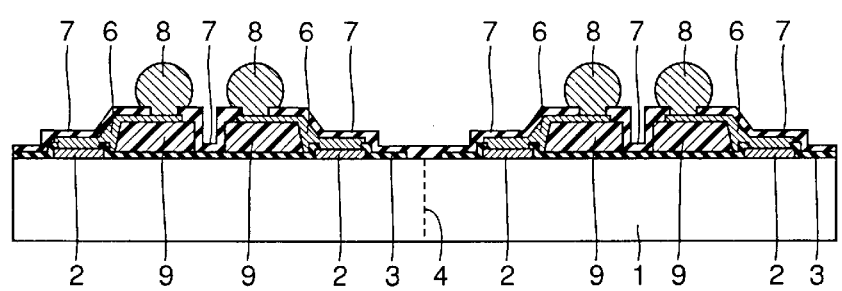
Figure 16A:
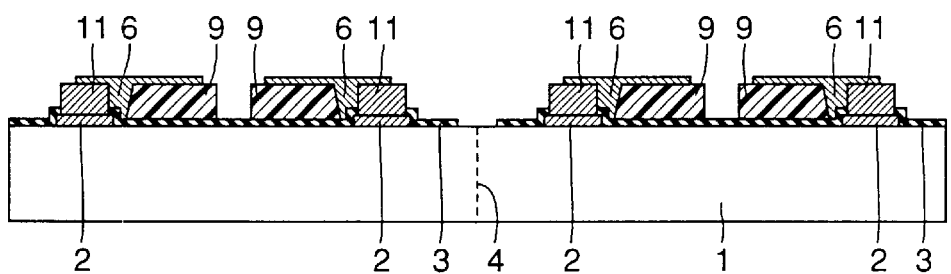
FIGS. 16A and 16B show another example of forming rewiring pattern 6 of the semiconductor device according to the fifth embodiment.
Figure 16B:
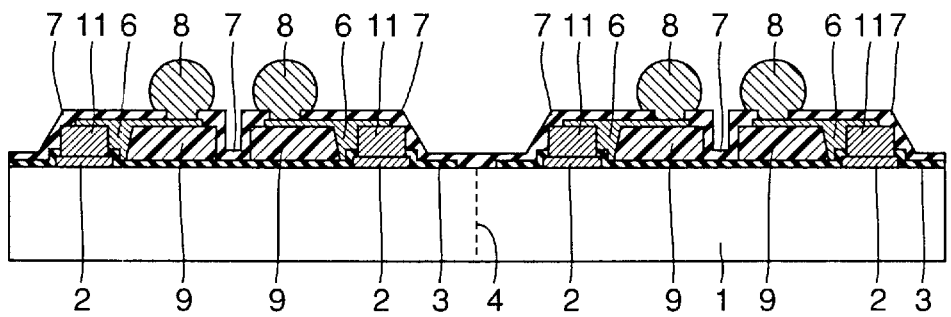

Still further, according to the semiconductor device of this embodiment, as shown in FIG. 14C, it is necessary to form rewiring pattern 6 on the slope of resin layer 9. If it is difficult to do so, however, rewiring pattern 6 may be readily formed by the manufacturing steps shown in FIGS. 16A and 16B. Specifically, after completion of the step of FIG. 14B, a connecting portion 11 of a conductive material is formed on electrode 2, as shown in FIG. 16A. Connecting portion 11 may be formed by electroless plating of nickel or the like, or alternatively, it may be formed by printing using conductive paste. After thus raising electrode 2, rewiring pattern 6 is formed, and then, the step shown in FIG. 16B (the same as those shown in FIGS. 14D and 14E) is performed to complete the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a plurality of externally connecting electrodes arranged on a semiconductor chip, comprising:
   on-chip electrodes;
   resin members formed separately from each other and provided corresponding to said plurality of said externally connecting electrodes, each of said resin members is arranged in an arbitrary position except on said on-chip electrodes; and
   interconnections, each of said interconnections connecting a corresponding on-chip electrode and a corresponding externally connecting electrode formed on a corresponding resin member.

2. The semiconductor device according to claim 1, wherein said interconnection has at least one portion with a multi-layered structure made of at least two kinds of materials.

3. The semiconductor device according to claim 1, wherein said resin member is formed of a material that expands when cured.

4. The semiconductor device according to claim 1, wherein said interconnection includes
   a first interconnection connecting s aid on-chip electrode and said resin member, and
   a second interconnection formed over a slope of said resin member and connecting said first interconnection and said externally connecting electrode.

5. The semiconductor device according to claim 1, further comprising a protection layer that is formed at least on a side where said externally connecting electrodes are being formed to cover the side except said externally connecting electrodes.

6. A semiconductor device having a plurality of externally connecting electrodes arranged on a semiconductor chip, comprising:
   on-chip electrodes;
   resin members having slopes and provided corresponding to said plurality of externally connecting electrodes; and
   interconnections, each of said interconnections formed along the slope of a corresponding resin member and connecting a corresponding on-chip electrode and a corresponding externally connecting electrode.

7. The semiconductor device according to claim 6, wherein said interconnection has at least one portion with a multi-layered structure made of at least two kinds of materials.

8. The semiconductor device according to claim 6, wherein said resin member is formed of a material that expands when cured.

9. The semiconductor device according to claim 6, wherein said interconnection includes
   a first interconnection connecting said on-chip electrode and said resin member, and
   a second interconnection formed over a slope of said resin member and connecting said first interconnection and said externally connecting electrode.

10. The semiconductor device according to claim 6, further comprising a protection layer that is formed at least on a side where said externally connecting electrodes are being formed to cover the side except said externally connecting electrodes.

11. A semiconductor device having a plurality of externally connecting electrodes arranged on a semiconductor chip, comprising:
   on-chip electrodes;
   a resin layer covering said semiconductor chip and having at least one opening, said externally connecting electrodes being formed immediately above the resin layer; and
   interconnections, each of said interconnections connecting a corresponding on-chip electrode and a corresponding externally connecting electrode.

12. The semiconductor device according to claim 11, wherein said opening is provided between said externally connecting electrodes at least one for every two adjacent externally connecting electrodes.

13. The semiconductor device according to claim 11, wherein said interconnection has at least one portion with a multi-layered structure made of at least two kinds of materials.

14. The semiconductor device according to claim 11, wherein said resin layer is made of a material that expands when cured.

15. The semiconductor device according to claim 11, wherein said interconnection includes
   a first interconnection connecting said on-chip electrode and said resin layer, and a second interconnection formed over a slope of said resin layer and connecting said first interconnection and said externally connecting electrode.

16. The semiconductor device according to claim 11, further comprising a protection layer that is formed at least on a side where said externally connecting electrodes are being formed to cover the side except said externally connecting electrodes.

* * * * *